United States Patent [19]
Zertani et al.

[11] Patent Number: 5,922,508
[45] Date of Patent: Jul. 13, 1999

[54] PHOTOPOLYMERIZABLE RECORDING MATERIAL

[75] Inventors: Rudolf Zertani, Mainz-Bretzenheim; Dieter Mohr, Budenheim; Werner Frass, Wiesbaden-Naurod, all of Germany

[73] Assignee: Agfa-Gevaert AG, Leverkusen, Germany

[21] Appl. No.: 08/977,618

[22] Filed: Nov. 25, 1997

Related U.S. Application Data

[63] Continuation of application No. 07/982,407, Nov. 27, 1992, abandoned, which is a continuation of application No. 07/386,244, Jul. 28, 1989.

[30] Foreign Application Priority Data

Aug. 11, 1988 [DE] Germany ............................... 38 27 245

[51] Int. Cl.[6] .................................................. G03C 1/492
[52] U.S. Cl. ...................... 430/273.1; 430/162; 430/166; 430/514; 430/531; 430/536; 430/271.1; 430/275.1; 430/277.1; 430/278.1
[58] Field of Search ............................... 430/273.1, 162, 430/166, 514, 536, 531, 278.1, 277.1, 275.1, 271.1

[56] References Cited

U.S. PATENT DOCUMENTS

| | | | |
|---|---|---|---|
| 2,791,504 | 5/1957 | Plambeck | 96/84 |
| 2,984,568 | 5/1961 | Hart et al. | 430/514 |
| 3,218,167 | 11/1965 | Burg et al. | 96/85 |
| 3,458,311 | 7/1969 | Alles | 96/35.1 |
| 3,884,693 | 5/1975 | Bauer et al. | 96/15 |
| 4,126,466 | 11/1978 | Roos | 96/84 UV |
| 4,173,673 | 11/1979 | Bratt et al. | 428/217 |
| 4,317,875 | 3/1982 | Scheler et al. | 430/162 X |
| 4,337,308 | 6/1982 | Franke | 430/306 |
| 4,557,996 | 12/1985 | Aoyama et al. | 430/324 |
| 4,983,498 | 1/1991 | Rode et al. | 430/915 X |

FOREIGN PATENT DOCUMENTS

| | | | |
|---|---|---|---|
| 1143207 | 3/1983 | Canada | 430/273 |
| 61-117549 | 6/1986 | Japan . | |
| 1 385 241 | 2/1975 | United Kingdom . | |
| WO 86/06182 | 10/1986 | WIPO . | |
| WO 86/07473 | 12/1986 | WIPO . | |

OTHER PUBLICATIONS

English translation of the full text of JP Kokai 61–117549, Jun. 4, 1986.

*Primary Examiner*—Mark Chapman
*Attorney, Agent, or Firm*—Foley & Lardner

[57] ABSTRACT

The invention describes a photopolymerizable recording material which comprises a photopolymerizable layer and a cover layer. The cover layer comprises a polymer which possesses low permeability to atmospheric oxygen and is soluble in water, and a water-soluble dye which absorbs light in the region from 300 to 700 nm and within this range has a non-absorbent region corresponding to the emission range of the copying light source.

The material can be sensitized for various spectral regions, for example, for UV light, visible light or laser light and has a higher resolving power than a corresponding material which does not contain a dye in the cover layer, while its photosensitivity remains unchanged or is only slightly reduced.

20 Claims, No Drawings

PHOTOPOLYMERIZABLE RECORDING MATERIAL

This application is a continuation of application Ser. No. 07/982,407, filed Nov. 27, 1992, now abandoned, which is a continuation of Ser. No. 07/386,244 filed Jul. 28, 1989.

BACKGROUND OF THE INVENTION

The present invention relates to a photopolymerizable recording material comprising a layer support, a photopolymerizable layer and a cover layer possessing low permeability to atmospheric oxygen. The material is especially suited for the production of printing plates, in particular planographic printing plates.

Printing plates of the type mentioned are known, for example from U.S. Pat. No. 3,458,311. The cover layers described therein consist of water-soluble polymers, for example polyvinyl alcohol, polyvinylpyrrolidone, gelatin or gum arabic. Of these substances, polyvinyl alcohol is preferred, since its barrier effect in respect of oxygen is very high.

Compared to negative working planographic printing plates based on diazonium compounds, most of the presently produced planographic printing plates based on photopolymerizable materials yield a clearly reduced image resolution. It is assumed that this loss in resolution is partly due to a dark reaction propagating in the layer after the light-induced polymerization of the image areas. Scattered light reflected by the support surface is also supposed to be one of the causes. Thus, the resolution can be improved by providing anti-halation layers between the support surface and the photopolymerizable layer or by adding dyes or UV-absorbers to the photopolymerizable layer itself. For this purpose, dyes or pigments absorbing in the wavelength range to which the layer is sensitive are generally used. Materials of this type are, for example, described in U.S. Pat. No. 2,791,504, U.S. Pat. No. 4,173,673, DE-A 22 02 360 and DE-A 26 58 422. The dyes described therein in particular reduce the proportion of scattered light caused by reflection at the support surface. Improved resolution as a result of the addition of dyes to the photosensitive layer itself is in particular possible using dyes which absorb in the range of 350 to 450 nm. However, the improved resolution always results in a considerably reduced photosensitivity.

U.S. Pat. No. 3,218,167 discloses a photopolymerizable material for the production of transfer images by means of the peel-apart process. Since this process requires a pronounced image contrast, the photopolymerizable layer must be strongly dyed by the addition of dyes. In order to avoid a severe reduction of the photosensitivity, the dye must absorb as little as possible in the actinic range of the photopolymer layer. But as most of the dyes employed still absorb relatively much light in the activating range of the photoinitiator, the photosensitivity is significantly reduced in general. No other effect of the dye additives is mentioned.

It is also known to inhibit the dark reaction by adding polymerization inhibitors and thus to improve the resolution. When these inhibitors are highly effective, they have in most cases the disadvantage of reducing the photosensitivity. Moreover, many of these inhibitors result in an undesirable discoloring of the layer after a certain storage period. A great number of the known inhibitors absorb in the wavelength range of 300 to 700 nm, which is important for the initiation of the photopolymerization, and thus disturb or inhibit the imagewise polymerization.

From International Patent Application WO 86/7473 it is known to provide positive-working photoresist materials based on naphthoquinonediazides with a contrast-enhancing cover layer which is bleached by exposure to light in the actinic region. The resolution of these highly resolving materials is further improved by the increased image contrast.

WO 86/6182 describes a color proofing method where an optical filter layer is provided between the positive working photosensitive layer of the color proofing film and the color separation, in order to prevent halftone dot gain and to extend the exposure latitude. The filter layer must absorb light in the region of maximum absorbance of the photosensitive layer.

DE-C 21 23 702 describes a photopolymerizable dry resist material where a release layer containing a compound of low permeability to oxygen is present between the peelable temporary support film and the photopolymerizable layer. The release layer may be dyed with small amounts of a dye which is, however, not claimed to have any particular effect.

SUMMARY OF THE INVENTION

Accordingly, it is an object of the present invention to improve the resolving power of photopolymerizable layers, in particular of materials for the production of planographic printing plates, without a simultaneous substantial reduction of photosensitivity. The improved resolution should be accomplished particularly in the case of highly photosensitive layers based on polymerizable compounds possessing photooxidizable groups in combination with photoreducible dyes and optionally further compounds having a synergistic effect as photoinitiators, whereby the effectiveness of this initiator combination should not be impaired by disturbing layer additives.

In accomplishing the foregoing and other objectives, there has been provided, in accordance with one aspect of the present invention, a photopolymerizable recording material comprising a layer support, a photopolymerizable layer, and a cover layer comprising a polymer which possesses low permeability to oxygen and is soluble in water or a water/alcohol mixture, and a dye or combination of dyes which at 20° C. are soluble in water, absorb light in the range of about 300 to 700 nm and within this range have a non-absorbent region corresponding to the emission range of the desired copying light source.

Other objects, features and advantages of the present invention will become apparent to those skilled in the art from the following detailed description. It should be understood, however, that the detailed description and specific examples, while indicating preferred embodiments of the present invention, are given by way of illustration and not limitation. Many changes and modifications within the scope of the present invention may be made without departing from the spirit thereof, and the invention includes all such modifications.

DETAILED DESCRIPTION OF THE PREFERRED EMBODIMENTS

Within the scope of the present invention, the term "dye" is defined as meaning any compound exhibiting an intense light absorption in the above mentioned spectral region, i.e., it also includes compounds which absorb in the UV region and are only weakly dyed or are not dyed at all in the visible spectral region.

Therefore, suitable dyes include, inter alia, UV absorbers, photosensitive compounds, such as diazonium salts and 1,2-quinonediazides, di- or triarylcarbenium dyes, azo dyes, aza(18)annulene dyes, nitro dyes, nitrose dyes, polymethine dyes, carbonyl dyes or sulphur dyes.

Of these dyes, preference is given to carbonyl dyes, particularly anthraquinone dyes, azo dyes, triarylcarbenium dyes, particularly triphenylmethane dyes, aza(18)annulene dyes, e.g., water-soluble porphyrine or phthalocyanine dyes, and to polymethine dyes.

Examples of suitable dyes include 2,2'-Dihydroxy-4-methoxybenzophenone, 4-dodecyloxy-2-hydroxy-benzophenone, 2,4-dihydroxybenzophenone, hydroxyphenylbenzotriazole, Resorcinol monobenzoate, Oil Orange (C.I. 12 055), Sudan Orange RA (C.I. 12 055), Capracyl Orange (C.I. 60), Sudan Yellow (C. I. 30), Sirius Light Yellow R extra (C. I. 29 025), Remazol Brilliant Orange RR (C.I. 17 756), Remazol Brilliant Orange 3R (C. I. 17 757), Remazol Gold Yellow G (C.I. 18 852), Remazol Yellow RTL (Reactive Yellow 24), Fast Light Yellow 3G (C.I. 19 120), Astrazon Yellow 3G (C.I. 48 055), Astrazon Yellow 5G (C.I. 48 065) or Basic Yellow 52 115 (C.I. 48 060), Astrazon Orange 3R (Basic Orange 22), Astrazon Yellow 7 GLL, Astrazon Yellow GRL, Astrazon Yellow Brown 3 GL (Basic Orange 3012), Astrazon Blue 3 RL (Basic Blue 47), Basic Blue 3 RL, Methylene Blue, Irgacet Blue 2 GLN, Bromophenol Blue (CAS-62625-28-9), Serva Blue G, Corvolin Yellow HG, Novofil Yellow GR (Pigment Yellow 13), Orasol Yellow, Remazol Yellow, Tartrazine, Zapon Fast Yellow CGG, Fatty Yellow, Maxilon Brilliant Yellow, Remacryl Yellow, Astrazon Red Violet 3 RN, Astrazon Violet F3 RL, Astrazon Green M, Brilliant Green (42040), Methyl Orange, Methyl Red, Duasyn Acid Blue R, Victoria Blue FB (44045), Orasol Red B, Remazol Yellow Orange, Orasol Orange RW-A, Acid Green, Maxilon Red GRL, Maxilon Red BL-N, Nubilon Orange R (Acid Orange 7) and Astra Yellow R. Particularly suited are Astrazon Orange R (C.I. 48 040), Astrazon Yellow Brown 3 GL, Bromophenol Blue, Methylene Blue, Maxilon Blue GRL and Astrazon Blue 3 RL. Furthermore, oxadiazole derivatives according to DE-A 1 058 836, 6-phenyl-2-pyrones (DE-A 16 68 358), 4,4'-dibenzal acetones, e.g., 4-diethylamino-4'-methoxy-dibenzalacetone, and coumarine derivatives, e.g., 3-acetyl-7-diethylamino coumarine, are well suited.

Furthermore, photosensitive compounds, such as diazonium salts or quinone diazides, which are sensitive in a spectral region of 280 to 450 nm, are suitable as dyes. By incorporating these yellow components into the cover layer the resolving power of negative-working layers can likewise be increased significantly.

By applying optical filter layers, "optical windows", which depend on the selected dye and its absorption properties, can be produced with a panchromatically sensitized photopolymer layer being sensitive in a spectral region of 300 to 700 nm. In this way, printing plates for the following fields of application can be produced on a basis of one single, highly photosensitive photopolymer layer:

a) projection exposure (400–450 nm)
b) laser exposure (488 and 514 nm; Argon ion laser)
c) UV exposure (up to 400 nm).

In the material according to the instant invention, the dyes are present in the cover layer, acting both as a filter layer and as an oxygen barrier layer, in an amount effective to achieve the desired properties. The dye concentration in the cover layer depends, inter alia, on the intended application of the photosensitive recording material (e.g., as an offset printing plate for projection exposure, as a printing plate which can be imaged by means of laser irradiation, as a UV-sensitive printing plate or as a photoresist), on the thickness of the cover layer, on the composition of the photopolymerizable layer, on the type of sensitization and on the type and intensity of the light sources employed, and therefore can vary within wide limits.

In general, the amount of dye contained in the cover layer is about 0.01 to 70% by weight, preferably 0.05 to 50% by weight, and more preferably 0.5 to 25% by weight. It should be selected such that in the absorption range of the dye the cover layer has an optical density of about 0.5 to 2.5.

The polymer which is little permeable to atmospheric oxygen can be one of the polymers indicated in U.S. Pat. No. 3,458,311. Examples are in particular polyvinyl alcohol and partially hydrolyzed polyvinyl acetates, which may also contain vinyl ether and vinyl acetal units as long as the polymer remains soluble at 20° C. in water or a mixture comprising water and a lower alcohol, such as ethanol, wherein the alcohol content is up to 50%, preferably up to 30%. It is also possible to use gelatin, gum arabic, copolymers of alkyl vinyl ethers and maleic anhydride, polyvinylpyrrolidones, polycarboxylic acids, water-soluble high molecular weight polymers of ethylene oxide (M=100, 000 to 3,000,000), water-soluble graft polymers of ethylene oxide on polyvinyl alcohol, hydrocarbons and hydroxyethyl cellulose. Preference is given to those polymers whose oxygen permeability in a layer at 20° C. is less than 30, in particular less than 25, $cm^3/m^2/d/bar$.

The cover layer should transmit actinic light and in general has a thickness of about 0.5 to 10, preferably 1 to 4, $\mu m$. It is applied on top of the photopolymerizable layer in a conventional manner from an aqueous solution or from a mixture of water and organic solvent. The coating solution may contain, for better wetting properties, up to about 10% by weight, preferably up to 5% by weight, of a surface-active agent, based on its solids content. The usable surface-active substances include the anionic, cationic and nonionic surface-active agents, for example sodium alkyl sulfates and sodium alkyl sulfonates having 12 to 18 carbon atoms such as sodium dodecyl sulfate, N-cetyl-betains, C-cetylbetains, alkylaminocarboxylates, alkylaminodicarboxylates, and polyethylene glycols having an average molecular weight of up to about 400.

The photopolymerizable layers of the recording materials according to the invention comprise a polymeric binder, a free-radical-polymerizable compound having at least one, preferably at least two, terminal ethylenically unsaturated groups, and a polymerization initiator or initiator combination which can be activated by actinic light.

Polymerizable compounds suitable for the purposes of the invention are known and described for example in U.S. Pat. No. 2,760,863 and U.S. Pat. No. 3,060,023.

Preferred examples are acrylic and methacrylic acid esters of dihydric or polyhydric alcohols, such as ethylene glycol diacrylate, polyethylene glycol dimethacrylate, acrylates and methacrylates of trimethylolethane, trimethylolpropane, pentaerythritol and dipentaerythritol and of polyhydric alicyclic alcohols or N-substituted acrylamides and methacrylamides. It is also advantageous to use reaction products or monoisocyanates or diisocyanates with partial esters of polyhydric alcohols. Such monomers are described in DE-A 2,064,079, DE-A 2,361,041 and DE-A 2,822,190.

Particular preference is given to polymerizable compounds which contain at least one photooxidizable group alone or together with one or more urethane groups in the molecule.

Suitable photooxidizable groups are in particular amino groups, urea groups, thio groups, which may also be the constituents of heterocyclic rings, and enol groups. Examples of such groups are triethanolamino, triphenylamino, thiourea, imidazole, oxazole, thiazole, acetylacetonyl, N-phenylglycine and ascorbic acid groups. Polymerizable compounds having primary, secondary and in particular tertiary amino groups are preferred.

Examples of compounds having photooxidizable groups are acrylic and alkacrylic acid esters of the formula I $$R_{(m-n)}Q[(-CH_2-\underset{R^2}{\overset{R^1}{\underset{|}{\overset{|}{C}}O}})_a-CONH(X^1-NHCOO)_b-X^2(-OOC-\underset{}{\overset{R^3}{\overset{|}{C}}}=CH_2)_c]_n \qquad (I)$$

where

| Q | is 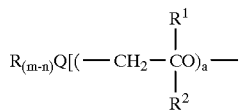, 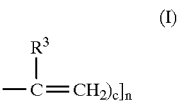 or —S— |
|---|---|
| R | is an alkyl, hydroxyalkyl or aryl group, |
| $R^1$ and $R^2$ | are each a hydrogen atom, an alkyl group or an alkoxyalkyl group, |
| $R^3$ | is a hydrogen atom or a methyl or ethyl group, |
| $X^1$ | is a saturated hydrocarbon group of 2 to 12 carbon atoms, |
| $X^2$ | is a (c + 1)-valent saturated hydrocarbon group in which up to 5 methylene groups may have been replaced by oxygen atoms, |
| $D^1$ and $D^2$ | are each a saturated hydrocarbon group of 1 to 5 carbon atoms, |
| E | is a saturated hydrocarbon group of 2 to 12 carbon atoms, a cycloaliphatic group of 5 to 7 ring members which may contain up to two N, O or S atoms as ring members, an arylene group of 6 to 12 carbon atoms or a heterocyclic aromatic group of 5 to 6 ring members, |
| a | is 0 or an integer from 1 to 4, |
| b | is 0 or 1, |
| c | is an integer from 1 to 3, |
| m | is 2, 3 or 4, depending on the valence of Q, and |
| n | is an integer from 1 to m, | with all the symbols of identical definition being identical to or different from one another.

The compounds of this formula, and the preparation and use thereof are described in detail in earlier German Patent Application P 37 10 279.6, corresponding to U.S. application Ser. No. 07/173,936 now U.S. Pat. No. 4,983,498.

If in the compound of the general formula I more than one radical R or more than one radical of the type indicated in square brackets is bonded to the central group Q, these radicals can be different from one another.

Compounds in which all the substituents of Q are polymerizable radicals, i.e. where m=n, are in general preferred.

In general, not more than one radical a is 0, and preferably a is 1.

An alkyl or hydroxyalkyl group R generally has 2 to 8, preferably 2 to 4, carbon atoms. An aryl radical R can in general be mononuclear or binuclear, preferably mononuclear, and may be substituted by alkyl or alkoxy groups of up to 5 carbon atoms or by halogen atoms.

Alkyl and alkoxyalkyl groups $R^1$ and $R^2$ can contain 1 to 5 carbon atoms.

$R^3$ is preferably a hydrogen atom or a methyl group, in particular a methyl group.

$X^1$ is preferably a straight-chain or branched aliphatic or cycloaliphatic radical of preferably 4 to 10 carbon atoms.

$X^2$ preferably has 2 to 15 carbon atoms, of which up to 5 may have been replaced by oxygen atoms. In the case of pure carbon chains, generally those having 2 to 12, preferably 2 to 6, carbon atoms are used. $X^2$ can also be a cycloaliphatic group of 5 to 10 carbon atoms, in particular a cyclohexylene group.

$D^1$ and $D^2$ can be identical or different, and together with the two nitrogen atoms form a saturated heterocyclic ring of 5 to 10, preferably 6, ring members.

An alkylene group E preferably has 2 to 6 carbon atoms, and an arylene group E is preferably a phenylene group. Preferred cycloaliphatic groups are cyclohexylene groups and preferred aromatic heterocycles are those having N or S as heteroatoms and 5 or 6 ring members.

The value of c is preferably 1.

The polymerizable compounds of the formula I which contain two urethane groups in every radical (b=1) are prepared by reacting acrylic or alkylacrylic acid esters which contain free hydroxyl groups in a conventional manner with the same molar amount of diisocyanates and reacting the excess isocyanate group with hydroxylalkylamines, N,N-bis-hydroxyalkylpiperazines or N,N,N',N'-tetrahydroxyalkyl-akylenediamines, in each of which individual hydroxyalkyl groups may have been replaced by alkyl or aryl groups R. If a is 0, the result is a urea grouping. Examples of the hydroxyalkylamine starting materials are triethanolamine, N-alkyl-N,N-di(hydroxyalkyl)amines, diethanolamine, tris(2-hydroxypropyl)amine and tris(2-hydroxybutyl)amine.

Examples of diisocyanate starting materials are hexamethylene diisocyanate, 2,2,4-trimethylhexamethylene diisocyanate, 1,4-cyclohexylene diisocyanate and 1,1,3-trimethyl-3-isocyanatomethyl-5-isocyanatocyclohexane.

The hydroxyl-containing esters used are in particular hydroxyethyl methacrylate and hydroxypropyl methacrylate (n or iso) and the corresponding acrylates.

The polymerizable compounds of the formula I where b is 0 are prepared by reacting the above-described hydroxyalkylamino compounds with isocyanato-containing acrylic or alkyacrylic acid esters. An isocyanato-containing ester used in particular is isocyanatoethyl (meth)acrylate.

Further suitable compounds having photooxidizable groups are compounds of the formula II

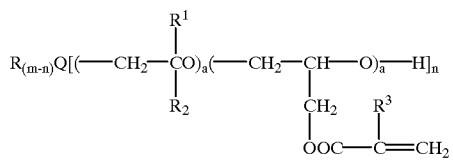 (II)

where Q, R, $R^1$, $R^2$, $R^3$, a, m and n are each as defined above and Q can additionally be a group

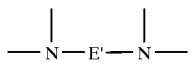

where E' is a group of the formula III

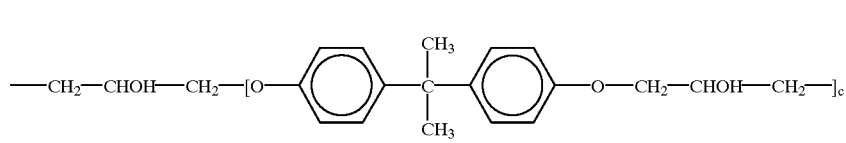

where c has the same meaning as in formula I.

The compounds of the formula II are prepared similarly to those of the formula I, except that the hydroxyalkyl (alk) acrylates are replaced by the corresponding glycidyl (alk) acrylates.

The compounds of this formula and the preparation and use thereof are described in detail in earlier German Patent Application P 37 38 864.9, corresponding to U.S. Application No. 07/270,351.

Further suitable compounds having photooxidizable groups are acrylic and alkacrylic esters of the formula IV

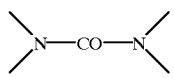 (IV)

where

| Q' | is 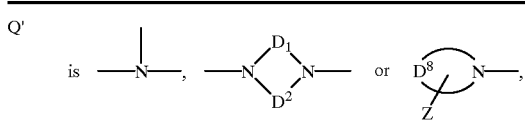, |
|---|---|
| $X^{1'}$ | is $C_iH_i$ or |

| $D^3$ | is a saturated hydrocarbon group of 4 to 8 carbon atoms which together with the nitrogen atom forms a 5-or 6-membered ring, |
|---|---|
| Z | is a hydrogen atom or a radical of the formula |

| i and k | are integers from 1 to 12, |
|---|---|
| n' | is 1, 2 or 3 depending on the valence of Q', and |

$R^3$, $X^1$, $X^2$, $D^1$, $D^2$, a and b are each as defined at the formula I, with all the symbols of identical definition being identical or different from one another and, in at least one substituent on the group Q, a=0.

Of the compounds of the formula IV, those which apart from a urethane group contain at least one urea group are preferred. Urea groups are for the purposes of the present invention groups of the formula

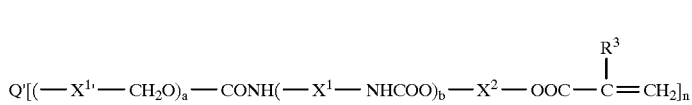

where the valences on the nitrogen are saturated by substituted or unsubstituted hydrocarbon radicals. However, it is also possible for one valence on one nitrogen atom to be bonded to a further carbonylamide group (CONH), producing a biuret structure.

The symbol a in the formula IV is preferably 0 or 1; i is preferably a number from 2 to 10.

The polymerizable compounds of the formula IV are prepared in the same way as compounds of the formula I.

The compounds of the formula IV and the preparation thereof are described in detail in earlier German Patent Application P 38 24 903.0.

The proportion of photopolymerizable compounds in the photopolymerizable layer is in general about 10 to 80, preferably 20 to 60, % by weight, based on the nonvolatile constituents.

Examples of usable binders are chlorinated polyethylene, chlorinated polypropylene, poly(meth)acrylic acid alkyl esters where the alkyl group is for example methyl, ethyl, n-butyl, i-butyl, n-hexyl or 2-ethylhexyl, copolymers of said (meth)acrylic acid alkyl esters with at least one monomer, such as acrylonitrile, vinyl chloride, vinylidene chloride, styrene or butadiene, polyvinyl chloride, vinyl chloride/ acrylonitrile copolymers, polyvinylidene chloride, vinylidene chloride/acrylonitrile copolymers, polyvinyl acetate, polyvinyl alcohol, polyacrylonitrile, acrylonitrile/ styrene copolymers, acrylonitrile/butadiene/styrene copolymers, polystyrene, polymethyl styrene, polyamides (for example nylon-6), polyurethanes, methylcellulose, ethylcellulose, acetylcellulose, polyvinyl formal and polyvinyl butyral.

Of particular suitability are binders which are insoluble in water, soluble in organic solvents and soluble or at least swellable in aqueous alkaline solutions.

A special mention should be made of carboxyl-containing binders, for example copolymers of (meth)acrylic acid and/or unsaturated homologs thereof, such as crotonic acid, copolymers of maleic anhydride or of the half-esters thereof, reaction products of hydroxyl-containing polymers with dicarboxylic anhydrides, and mixtures thereof.

It is also possible to use reaction products of polymers which carry groups comprising acidic H atoms which have been wholly or partly reacted with activated isocyanates, for example reaction products of hydroxyl-containing polymers with aliphatic or aromatic sulfonyl isocyanates or phosphinic acid isocyanates.

Also suitable are: hydroxyl-containing polymers, for example copolymers of hydroxylalkyl (meth)acrylates, copolymers of allyl alcohol, copolymers of vinyl alcohol, polyurethanes or polyesters, and also epoxy resins, provided they carry a sufficient number of free OH groups or have been modified in such a way that they are soluble in aqueous alkaline solutions, or those polymers which carry aromatically bonded hydroxyl groups, for example condensation products of carbonyl compounds capable of condensation, in particular formaldehyde, acetaldehyde or acetone, with phenols or copolymers of hydroxystyrenes. Finally, it is also possible to use copolymers of (meth)acrylamide with alkyl (meth)acrylates.

The above-described polymers are suitable in particular when they have a molecular weight between about 500 and 200,000 or higher, preferably between 1,000 and 100,000, and either acid numbers between about 10 and 250, preferably between 20 and 200 or hydroxyl numbers between about 50 and 750, preferably between 100 and 500.

Preferred alkali-soluble binders are:

Copolymers of (meth)acrylic acid with alkyl (meth) acrylates, (meth)acrylonitrile or the like, copolymers of crotonic acid with alkyl (meth)acrylates, (meth)acrylonitrile or the like, copolymers of vinylacetic acid with alkyl (meth) acrylates, copolymers of maleic anhydride with substituted or unsubstituted styrenes, unsaturated hydrocarbons, unsaturated ethers or esters, esterification products of copolymers of maleic anhydride, esterification products of hydroxyl-containing polymers with anhydrides of di- or polycarboxylic acids, copolymers of hydroxyalkyl (meth)acrylates with alkyl (meth)acrylates, (meth)acrylonitrile or the like, copolymers of allyl alcohol with substituted or unsubstituted styrenes, copolymers of vinyl alcohol with alkyl (meth) acrylates or other polymerizable unsaturated compounds, polyurethanes, provided they have a sufficient number of free OH groups, epoxy resins, polyesters, partially hydrolyzed vinyl acetate copolymers, polyvinyl acetals having free OH groups, copolymers of hydroxystyrenes with alkyl (meth)acrylates or the like, phenol-formaldehyde resins, for example novolaks.

The amount of binder in the light-sensitive layer is in general about 20 to 90, preferably 40 to 80, % by weight.

The photoinitiators used can be a large number of substances. Examples are those which are derived from the basic skeletons of benzophenones, acetophenones, benzoins, benzils, benzil monoketals, fluorenone, thioxanthone, polynuclear quinones, acridines and quinazolines, and also trichloromethyl-s-triazines, 2-halomethyl-5-vinyl-1,3,4-oxadiazole derivatives, trichloromethyl-substituted halooxazoles or trihalomethyl-containing carbonylmethylene heterocycles as described in DE-A-3,333,450.

Preferred photoinitiators are photoreducible dyes, in particular if combined with radiation-cleavable trihalomethyl compounds and perhaps with acridine, phenazine or quinoxaline photoinitiator compounds as described in earlier German Patent Applications P 37 10 281.8 and P 37 10 282.6, corresponding to U.S. applications Ser. Nos. 07/173, 559 and 07/174,426.

Suitable photoreducible dyes are in particular xanthene, benzoxanthene, benzothioxanthene, thiazine, pyronine, porphyrin and acridine dyes. The amount of dye is in general between about 0.01 and 10, preferably between 0.05 and 4, % by weight, based on the nonvolatile constituents of the layer.

To increase the photosensitivity, layers may have added to them compounds having photolytically cleavable trihalomethyl groups which are known per se for use as free-radical-forming photoinitiators for photopolymerizable mixtures. Proven coinitiators of this type are in particular compounds containing chlorine and bromine, especially chlorine, as halogens. The trihalomethyl groups can be bonded directly or via a fully conjugated chain to an aromatic carbocyclic or heterocyclic ring. Preference is given to compounds having a triazine ring in the basic skeleton which preferably carries 2 trihalomethyl groups, in particular to the compounds described in EP-A-137,452, DE-A-2,718,259 and DE-A-2, 243,621. These compounds are strongly absorbing in the near UV range, around 350–400 nm. It is also possible to use coinitiators which themselves show little if any absorption in the spectral region of the copying light, such as trihalomethyltriazines which contain substituents having comparatively short mesomerism-capable electron systems or aliphatic substituents. It is also possible to use compounds having a different basic structure which absorb in the shorter-wave UV region, for example phenyl trihalomethyl sulfones or phenyl trihalomethyl ketones, such as phenyl tribromomethyl sulfone.

These components are in general used in an amount of about 0.01 to 10, preferably 0.05 to 6, % by weight, based on the nonvolatile constituents of the layer.

The materials according to the invention preferably contain as a further initiator constituent an acridine, phenazine or quinoxaline compound. These compounds are known for use as photoinitiators and are described in DE-C-2,027,467 and DE-C-2,039,861. These compounds increase the sensitivity of the mixture in particular in the near ultraviolet region. The amount of this component is likewise within the range from about 0.01 to 10% by weight, preferably between 0.05 and 5% by weight.

If a further increase in the sensitivity in the visible region of the spectrum is desired, it can be brought about by adding a compound of the dibenzalacetone or coumarine type. This addition gives a more highly resolved copy and complete sensitization of the mixture to the visible region of the spectrum up to wavelengths of about 600 nm. The amount of this compound is likewise within the range from about 0.01 to 10, preferably from 0.05 to 4, % by weight.

The total amount of polymerization initiator is in general about 0.05 to 20, preferably 0.1 to 10, % by weight.

The photopolymerizable layers may contain various substances as additives depending on the intended use and the desired properties. Examples are: inhibitors for preventing thermal polymerization of the monomers, hydrogen donors, dyes, colored and uncolored pigments, color-forming components, indicators, plasticizers and chain transfer agents. These constituents are expediently selected in such a way that they absorb as little as possible of the actinic region important for the process of initiation.

For the purposes of the present invention, actinic radiation is any radiation whose energy is at least equal to that of visible light. It is possible to use in particular visible light and long-wave UV radiation, but also short-wave UV radiation, laser light, electron beams and X-rays. The light sensitivity ranges from about 300 nm to 700 nm and hence covers a very wide range.

Suitable applications for the material according to the invention are: recording layers for the photomechanical production of printing plates for letterpress printing, planographic printing, intaglio printing and screen printing, relief copies, for example production of texts in braille, individual copies, tanned images, pigment images, etc. The mixtures can also be used for the photomechanical production of etch resists, for example for fabricating name tags or copied circuits and for chemical milling. The mixtures according to the invention are particularly important as recording layers for the production of planographic printing plates and for photoresist technology.

Suitable support materials for the recording material according to the invention are for example aluminum, steel, zinc and copper foils, plastics films, for example polyethylene terephthalate or cellulose acetate films, and screen printing materials, such as Perlon gauze. It is in many cases advantageous to subject the surface of the support material to a pretreatment (chemical or mechanical) with the aim of correctly adjusting the adhesion of the layer, improving the lithographic properties of the surface of the support material, or reducing the reflectivity of the support material in the actinic region of the copying layer (anti-halation).

The light-sensitive materials are fabricated in a conventional manner. For instance, it is possible to take up the layer constituents in a solvent, to apply the solution or dispersion to the intended support material by casting, spraying, dipping, roller coating and the like, and then to dry.

Owing to the broad spectral sensitivity of the recording material according to the invention, it is possible to use any light source familiar to those skilled in the art, for example fluorescent tubes, pulsed xenon lamps, metal-halide-doped high-pressure mercury vapor lamps and carbon arc lamps. In addition, it is possible to irradiate the light-sensitive mixtures according to the invention in conventional projection and magnification equipment with the light from metal filament lamps and by contact exposure with customary incandescent lamps. Irradiation can also be effected with the coherent light of a laser. Suitable for the purposes of the present invention are lasers of appropriate power, for example argon ion, kryption ion, dye, helium-cadmium and helium-neon lasers, which emit in particular in the range from 250 to 650 nm. The laser beam can be controlled by means of a preprogrammed linewise scanning movement.

The materials are further processed in a conventional manner. To effect better crosslinking in the layers, it is possible to heat after exposure. To develop them, they are treated with a suitable developer solution, for example with organic solvents, but preferably with a weakly alkaline aqueous solution, which serves to remove the unexposed areas of the layer, leaving behind the exposed areas of the copying layer on the support material. The developer solutions may contain a small amount, preferably less than about 5% by weight, of water-miscible organic solvents. They may further contain wetting agents, dyes, salts and other additives. In the course of development, the entire cover layer is removed together with the unexposed areas of the photopolymerizable layer.

Below, the invention is described in detail with reference to illustrative embodiments. Parts by weight (p.b.w) bear the same relation to parts by volume (p.b.v.) as the g to the $cm^3$. Percentages and mixing ratios are by weight, unless otherwise stated.

EXAMPLE 1 (COMPARATIVE EXAMPLE)

The support material used for printing plates was electrochemically grained and anodically oxidized aluminum which had an oxide layer weighing 3 $g/m^2$ and had been pretreated with an aqueous solution of polyvinylphosphonic acid. The support material was coated with a solution of the following composition:

| | |
|---|---|
| 2.84 p.b.w. | of a 22.3% strength solution in methyl ethyl ketone, of aterpolymer of styrene, n-hexyl methacrylate and methacrylic acid (10:60:30) having an acid number of 190, |
| 1.49 p.b.w. | of the reaction product of triethanolamine with 3 moles of isocyanatoethyl methacrylate, |
| 0.04 p.b.w. | of alcohol-soluble Eosine (C.I. 45 386), |
| 0.03 p.b.w. | of 2,4-bis-trichloromethyl-6-(4-styrylphenyl)-s-triazine, |
| 0.049 p.b.w. | of 9-phenylacridine, and |
| 0.1 p.b.w. | of a carbonyl compound (Table I), in |
| 22 p.b.w | of propylene glycol monomethyl ether. |

Application was by spin-coating in such a way that a dry weight of 2.0 to 2.5 $g/m^2$ was obtained. The plate was then dried at 100° C. in a through-circulation cabinet for two minutes. The plate was then coated with an undyed 7% strength aqueous solution of polyvinyl alcohol (12% of residual acetyl groups, K value 4). Drying left a cover layer having a weight of 2 to 2.5 $g/m^2$. The printing plate obtained was exposed by means of a 5 kW metal halide lamp at a distance of 110 cm under a 13-step exposure wedge with density increments of 0.15 onto which, where indicated, in addition a silver film of uniform blacking (density 1.57) and uniform absorption across the entire effective spectrum was mounted as a gray filter. To test the sensitivity of the printing plates in visible light, 3 mm thick cut-off filters from Schott having the cut-off transmissibilities indicated in the table were mounted on the exposure wedge. To measure the spectral sensitivity range of the plates, exposure was performed through an interference filter of 300 to 700 nm, using parallel light from a 500 W incandescent bulb arranged at a distance of 75 cm. Following exposure, the plates were heated to 100° C. for one minute. Then development was performed using a developer of the following composition:

| | |
|---|---|
| 120 p.b.w. | of sodium metasilicate × $9H_2O$, |
| 2.13 p.b.w. | of strontium chloride, |
| 1.2 p.b.w. | of non-ionic wetting agent (coconut fatty alcohol polyoxyethylene ether containing about 8 ethyleneoxy units) and |
| 0.12 p.b.w. | of antifoam in |
| 4,000 p.b.w. | of fully demineralized water. |

It was found that the developed plates were completely hardened in the spectral regions indicated below. The resolving power of the printing plates was determined with a test original (FOGRA PMS wedge) and read off on the copy.

TABLE I

| Carbonyl compound | Exposure time (s) | Spectral region (nm) | Resolution (μm) |
|---|---|---|---|
| 4-dimethylamino-4'-methoxy-dibenzal-acetone | 30 | 300–550 | 15 |
| 3-acetyl-7-diethyl-amino coumarine | 30 | 300–585 | 12 |

Without the carbonyl compound, the plates were hardened in the regions from 300 to 430 nm and from 470 to 600 nm, respectively, after 30 seconds. Without the carbonyl compound and without the dye, the hardened region was 300 to 430 nm.

The plate without the carbonyl compound was inked with a greasy printing ink. The fully crosslinked wedge steps indicated below were obtained.

| Exposure (s) | Gray filter | Cut-off filter | Wedge steps | Resolution (μm) |
|---|---|---|---|---|
| 40 | yes | — | 5 | 25 |
| 40 | no | 455 | 5 | 25 |

EXAMPLE 2

The support material of Example 1 was coated with solutions of the following compositions in a way such that a layer weight of 2.0 g/m² was obtained in each case:

| 2.840 p.b.w. | of the terpolymer solution specified in Example 1, |
| 1.490 p.b.w. | of the polymerizable compound specified in Example 1, |
| 0.040 p.b.w. | of a dye (Table II), |
| 0.030 p.b.w. | of the s-triazine of Example 1, and |
| 0.049 p.b.w. | of 9-phenylacridine, in |
| 22.000 p.b.w. | of propylene glycol monomethyl ether. |

The plates of tests 1 to 4, 6, 8 and 10 were provided with a coating of polyvinyl alcohol as in Example 1. The plates of tests 5, 7 and 9 were coated with a cover layer of the same thickness, from a solution which additionally contained 0.25% of Astrazon Blue 3 RL (C. I. Basic Blue 47).

The spectral sensitivities were measured by exposure and development analogously to Example 1. The results are compiled in Tables II and III below:

TABLE II

| Test No. | Dye (C. I. No.) | Exposure time (s) | Hardened regions (nm) |
|---|---|---|---|
| 1 | Hematoporphyrine | 120 | 300–640 |
| 2 | Thionine (52000) | 180 | 300–440 and 550–640 |
| 3 | Cyanosine (45410) | 60 | 300–450 and 490–620 |
| 4 | Eosin (alcohol-soluble (45386) | 60 | 300–430 and |

TABLE II-continued

| Test No. | Dye (C. I. No.) | Exposure time (s) | Hardened regions (nm) |
|---|---|---|---|
| 5 | Pyronine GY (45005) | 120 | 300–450 and 480–530 |
| 6 | Rhodamine 6G (45160) | 60 | 300–480 and 510–600 |
| 7 | Erythrosine B (45430) | 90 | 300–440 and 480–560 |
| 8 | Methylene Blue (52015) | 180 | 400–450 and 570–690 |
| 9 | Thioflavine T (49005) | 180 | 350–480 |
| 10 | Acriflavinium chloride | 90 | 350–520 |

TABLE III

| Test No. | Exposure time (s) | Hardened region (nm) | Resolution (μm) |
|---|---|---|---|
| 5 | 60 | 300–430 | 15 |
| 7 | 60 | 300–430 | 20 |
| 9 | 60 | 350–430 | 15 |

EXAMPLE 3

Plates prepared as in Example 1, employing 4-dimethylamino-4'-methoxydibenzal acetone as carbonyl compound, were provided, by spin-coating, with cover layers of the following composition in lieu of the undyed polyvinyl alcohol cover layer:

100 p.b.w. of a 7% strength aqueous solution of polyvinyl alcohol (12% residual acetyl groups, K value 4) and 0.1 p.b.w. of a dye (Table IV)

Cover layer weights of 2 to 2.5 g/m² resulted after drying. The coated plates were exposed through an interference filter of 300 to 700 nm, with parallel light from a 500 W incandescent bulb arranged at a distance of 75 cm, and were subsequently baked in a through-circulation cabinet for 1 minute. Development was performed as described in Example 1, whereafter complete hardening was stated in the spectral regions specified in Table IV below.

TABLE IV

| Dye (C. I. No.) | Exposure time (s) | Spectral region (nm) |
|---|---|---|
| Astrazon Blue 3 RL (Basic Blue 47) | 60 | 300–450 |
| Victoria Blue FB (44045) | 60 | 300–450 |
| Astrazon Blue B (42140) | 60 | 300–450 |
| Bromophenol Blue, water-soluble (CAS-62625-28-9) | 60 | 300–480 |
| Novofil Yellow GR (Pigment Yellow 13) | 60 | 450–560 |
| Remazol Gold Yellow G (Reactive Yellow 17) | 60 | 440–560 |
| Astrazon Yellow Brown 3 GL (Basic Orange 3012) | 60 | 480–560 |
| Maxilon Red BL-N (Basic Red 22) | 60 | 400–470 and 560–680 |
| Astrazon Orange 3 R (Basic Orange 22) | 60 | 300–450 and 530–680 |

TABLE IV-continued

| Dye (C. I. No.) | Exposure time (s) | Spectral region (nm) |
|---|---|---|
| Brilliant Green (42040) | 60 | 460–550 |
| Remazol Turquoise Blue G (Reactive Blue 21) | 60 | 400–600 |
| Nubilon Orange R (Acid Orange 7) | 60 | 530–680 |

EXAMPLE 4

Under the conditions specified in Example 1, the support material of Example 1 was spin-coated with a solution of the following composition in a way such that a dry layer weight of 2.0 g/m² was obtained:

| 1.4 p.b.w. | of the terpolymer solution of Example 1, |
| 1.4 p.b.w. | of the reaction product of 1 mol of triethanolamine and 3 mol of isocyanatoethyl methacrylate, |
| 0.001 p.b.w. | of crystal violet base, |
| 0.04 p.b.w. | of leuco crystal violet, |
| 0.04 p.b.w. | of 9-phenylacridine, |
| 0.03 p.b.w. | of 2,4-bis-trichloromethyl-6-(4-styryl-phenyl)-s-triazine, and |
| 0.04 p.b.w. | of dibenzal acetone, in |
| 35.00 p.b.w. | of propylene glycol monomethyl ether. |

The plates were provided with polyvinyl alcohol cover layers as described in Example 3, which had been prepared using Astrazon Yellow Brown 3 GL, Astrazon Blue 3 RL and Victoria Blue FB, respectively, as dye. The cover layers had a dry layer weight of 2 g/m². These printing plates were exposed as in Example 1 using gray filters in all cases.

The effectiveness of the dyes added to the cover layer in respect of image resolution was determined using a FOGRA PMS Test Wedge as the original and read off on the copies.

A printing test gave 200,000 good prints.

TABLE V

| Dye | Exposure time (s) | Wedge steps | Resolution (μm) |
|---|---|---|---|
| Astrazon Yellow Brown 3 GL | 30 | 5 | 10 |
| Astrazon Blue 3 RL | 20 | 5 | 12 |
| Victoria Blue FB | 20 | 5 | 12 |

EXAMPLE 5

A printing plate was prepared as in Example 1 using 4-dimethylamino-4-'-methoxydibenzal acetone, but instead of the undyed polyvinyl alcohol cover layer, a cover layer of the following composition was applied by spin-coating:

100 p.b.w. of a 7% strength aqueous solution of polyvinyl alcohol (12% residual acetyl groups, K value 4).

0.1 p.b.w. of Astrazon Blue 3 RL and 0.1 p.b.w. of Maxilon Yellow 2 RL.

A dry layer weight of 2 to 2.5 g/m² resulted. As described in Example 1, the plates were exposed for 60 seconds through an interference filter and developed. Complete hardening was stated in the spectral region from 300 to 400 nm.

The resolution of the copy was 10 μm, determined with the FOGRA PMS wedge.

EXAMPLE 6

Under the same conditions as in Example 1, the support material of Example 1 was spin-coated with a solution of the following composition in a way such that a dry layer weight of 2.0 g/m² resulted:

| 1.4 p.b.w. | of the terpolymer solution of Example 1, |
| 1.4 p.b.w. | of the reaction product obtained from 1 mol of 2-piperidino-ethanol and 2 mol of isocyanatoethyl methacrylate, |
| 0.04 p.b.w. | of alcohol-soluble Eosine (C. I. 45386), |
| 0.03 p.b.w. | of 2,4-bis-trichloromethyl-6-(4-styryl-phenyl)-s-triazine, |
| 0.049 p.b.w. | of 9-phenylacridine, and |
| 22.00 p.b.w. | of propylene glycol monomethyl ether. |

The printing plate was cut into two. One half (plate A) was spin-coated with a cover layer comprising a 7% strength aqueous solution of polyvinyl alcohol (12% of residual acetyl groups, K value 8). The other half (plate B) was provided with a dyed cover layer of the following composition:

| 100 p.b.w. | of a 7% strength aqueous solution of polyvinyl alcohol (12% of residual acetyl groups, K value 8) and |
| 0.07 p.b.w. | of Astrazon Blue 3 RL. |

Each cover layer had a dry weight of 2 g/m². The printing plates obtained were exposed as in Example 4. The effectiveness of the dye in respect of the resolving power of the material was determined using a FOGRA PMS wedge as test original, and read off on the copy. To test the sensitivity of the printing plates in the visible spectral region, a cut-off filter was mounted on the exposure wedge. The exposed plates were heated to 100° C. for one minute in a through-circulation drying oven and then developed in accordance with Example 1.

TABLE VI

| | Exposure (s) | Gray Filter | Cut-off Filter (nm) | Wedge Steps | Resolution (μm) |
|---|---|---|---|---|---|
| Plate A | 20 | yes | — | 6 | 25 |
|  |  | no | 455 | 4 | 25 |
| Plate B | 20 | yes | — | 6 | 12 |
|  |  | no | 455 | — | — |

At wavelengths above 455 nm plate B was no longer sensitive.

What is claimed is:

1. A photopolymerizable recording material comprising
   a) a layer support,
   b) a photopolymerizable layer comprising
      i) a polymeric binder,
      ii) a polymerization initiator combination comprising at least one photoreducible dye and at least one photopolymerization initiator, and
      iii) a free-radical-polymerizable compound comprising an acrylic or alkacrylic acid ester of a polyhydric alcohol possessing at least one terminal ethylenically unsaturated group and at least one group which is photooxidizable by exposure in the presence of said polymerization initiator combination, and c) a cover layer comprising
  i) a polymer which possesses low permeability to oxygen and is soluble in water or a water/alcohol mixture, and
  ii) a dye or combination of dyes, which at 20° C. is soluble in water, absorbs light in the range of about 300 to 700 nm and within said range has a non-absorbent region from 350 to 400 nm, said dye or combination of dyes including a dye selected from the group consisting of a di- or triarylcarbenium dye, an azo dye, an aza(18)annulene dye, a nitro dye, a nitroso dye, a polymethine dye, a carbonyl dye, and a sulphur dye, wherein said photopolymerization initiator in said photopolymerizable layer absorbs light in said non-absorbent region of the dye or combination of dyes in said cover layer, said photopolymerizable layer is located between said layer support and said cover layer, and said cover layer is an outer layer of said material.

2. A recording material as claimed in claim 1, wherein the cover layer has a weight per unit area of between about 0.2 g/m$^2$ and 10 g/m$^2$.

3. A recording material as claimed in claim 1, wherein about 0.05 to 50% by weight of dye are contained in the cover layer.

4. A recording material as claimed in claim 1, wherein in the absorption region of the dye the cover layer has an optical density between about 0.5 and 2.5.

5. A recording material as claimed in claim 1, wherein the photopolymerizable layer comprises a photolytically cleavable trihalomethyl compound as a photopolymerization initiator and an acridine, phenazine or quinoxaline compound acting as a photopolymerization initiator.

6. A recording material as claimed in claim 1, wherein the binder is water-insoluble and soluble in aqueous-alkaline solutions.

7. A recording material as claimed in claim 1, wherein the photopolymerizable layer has a weight per unit area of about 0.5 to 20 g/m$^2$.

8. A recording material as claimed in claim 1, wherein the layer support has a hydrophilic surface suitable for planographic printing.

9. A recording material as claimed in claim 8, wherein the layer support has a surface selected from the group consisting of an aluminum, steel, zinc or copper foil, a plastic film and a perlon gauze.

10. A recording material as claimed in claim 1, consisting essentially of the recited components.

11. A recording material as claimed in claim 1, wherein said cover layer has a thickness of about 0.5 to 10 microns.

12. A recording material as claimed in claim 1, comprising about 10 to 80% by weight of said photopolymerizable compounds, about 20 to 90% by weight of said binder, and 0.01 to 10% by weight of said photoreducible dye, each percent based on the weight of nonvolatile constituents in said photopolymerizable layer.

13. A recording material as claimed in claim 12, wherein said photopolymerizable layer comprises about 0.01 to 10% by weight of compounds having photolytically cleavable trihalomethyl groups.

14. A recording material as claimed in claim 13, wherein said photopolymerizable layer comprises about 0.01 to 10% by weight of a compound selected from the group consisting of an acridine, a phenazine, and a quinoxaline.

15. A recording material as claimed in claim 14, wherein said photopolymerizable layer comprises about 0.01 to 10% by weight of a dibenzalacetone or coumarine compound.

16. A recording material as claimed in claim 1, wherein the polymer which possesses low permeability to oxygen and is soluble in water or a water/alcohol mixture is a polyvinyl alcohol.

17. A method of producing a printing plate, comprising:
providing a recording material as claimed in claim 1;
exposing said recording material to radiation from a copying light source having an emission range of 350 to 400 nm, whereby exposed areas of said recording material are hardened; and
developing said exposed recording material to remove the entire cover layer and unexposed areas of the photopolymerizable layer.

18. A photopolymerizable recording material comprising:
a) a layer support,
b) a UV-sensitive photopolymerizable layer on said support comprising
  i) a polymeric binder,
  ii) a polymerization initiator combination comprising at least one photopolymerization initiator that absorbs strongly at 350–400 nm and at least one photoreducible dye, and
  iii) a free-radical-polymerizable compound comprising an acrylic or alkacrylic acid ester of a polyhydric alcohol possessing at least one terminal ethylenically unsaturated group and at least one group which is photooxidizable by exposure in the presence of said polymerization initiator combination, and
c) an optical filter layer on said photopolymerizable layer comprising
  i) a polymer which possesses low permeability to oxygen and is soluble in water or a water/alcohol mixture, and
  ii) a dye or combination of dyes, which at 20° C. is soluble in water, absorbs light in the range of about 300 to 700 nm and within said range has an optical window from 350 to 400 nm, said dye or combination of dyes including a dye selected from the group consisting of a di- or triarylcarbenium dye, an azo dye, an aza(18)annulene dye, a nitro dye, a nitroso dye, a polymethine dye, a carbonyl dye, and a sulphur dye.

19. A photopolymerizable recording material comprising:
a) a layer support,
b) a panchromatically-sensitized photopolymerizable layer on said support, and
c) an optical filter layer on said photopolymerizable layer comprising
  i) a polymer which possesses low permeability to oxygen and is soluble in water or a water/alcohol mixture, and
  ii) a dye or combination of dyes, which at 20° C. is soluble in water, absorbs light in the range of about 300 to 700 nm and within said range has a non-absorbing optical window.

20. A recording material as claimed in claim 19, wherein said panchromatically-sensitized photopolymerizable layer contains (a)-sensitizers for projection exposure at wavelengths of 400–450 nm, (b) sensitizers for laser exposure at wavelengths of 488 or 514 nm; and (c) sensitizers for UV exposure at wavelengths up to 400 nm.

* * * * *